(12) United States Patent
Baik et al.

(10) Patent No.: US 7,609,805 B2
(45) Date of Patent: Oct. 27, 2009

(54) MASK USED FOR LIGA PROCESS, METHOD OF MANUFACTURING THE MASK, AND METHOD OF MANUFACTURING MICROSTRUCTURE USING LIGA PROCESS

(75) Inventors: Chan-wook Baik, Yongin-si (KR); Yong-wan Jin, Yongin-si (KR); Gun-sik Park, Seoul (KR); Jong-min Kim, Yongin-si (KR); Young-min Shin, Seoul (KR); Jin-kyu So, Seoul (KR)

(73) Assignees: Samsung Electronics Co., Ltd., Gyeonggi-do (KR); Seoul National University Industry Foundation, Seoul (KR)

( * ) Notice: Subject to any disclaimer, the term of this patent is extended or adjusted under 35 U.S.C. 154(b) by 77 days.

(21) Appl. No.: 11/896,273

(22) Filed: Aug. 30, 2007

(65) Prior Publication Data
US 2008/0166640 A1   Jul. 10, 2008

(30) Foreign Application Priority Data
Jan. 4, 2007   (KR) ...................... 10-2007-0001159

(51) Int. Cl.
*G21K 5/00* (2006.01)
(52) U.S. Cl. .............................. 378/35; 378/34; 430/5
(58) Field of Classification Search .................. 378/34, 378/35; 430/5
See application file for complete search history.

(56) References Cited

U.S. PATENT DOCUMENTS 5,378,583 A * 1/1995 Guckel et al. ............... 430/325
5,908,719 A * 6/1999 Guckel et al. ................. 430/5

* cited by examiner

*Primary Examiner*—Jurie Yun
(74) *Attorney, Agent, or Firm*—Harness, Dickey & Pierce, P.L.C.

(57) ABSTRACT

A mask used for a Lithographie, Galvanofomung, and Abformung (LIGA) process, a method for manufacturing the mask, and a method for manufacturing a microstructure using a LIGA process. The method for manufacturing the microstructure using the LIGA process contemplates forming a substrate for the microstructure, a plurality of photosensitive layers, each photosensitive layer having a plating hole and an aligning pinhole, and an aligning pin capable of being inserted into the aligning pinhole, with the aligning pinholes of the photosensitive layers being formed in corresponding positions, and repeating a process of stacking the photosensitive layer on the substrate for the microstructure and a process of forming a plating layer by plating the plating hole of the stacked photosensitive layer with a metal for a number of times corresponding to the number of the photosensitive layers, and when the photosensitive layers are stacked on the substrate for the structure, the photosensitive layers being aligned with one another by inserting the aligning pin into the aligning pinholes of all the photosensitive layers stacked on the substrate for the microstructure to penetrate all the photosensitive layers.

19 Claims, 8 Drawing Sheets

MASK USED FOR LIGA PROCESS, METHOD OF MANUFACTURING THE MASK, AND METHOD OF MANUFACTURING MICROSTRUCTURE USING LIGA PROCESS

CLAIM OF PRIORITY

This application makes reference to, incorporates the same herein, and claims all benefits accruing under 35 U.S.C. §119 from an application earlier filed in the Korean Intellectual Property Office on Jan. 4, 2007 and there duly assigned Serial No. 10-2007-0001159.

BACKGROUND OF THE INVENTION

1. Field of the Invention

The present invention relates to manufacturing a microstructure using a Lithographie, Galvanofomung, and Abformung (LIGA) process, and more particularly, to a mask used for a LIGA process, a method for manufacturing the mask, and a method for manufacturing a microstructure using a LIGA process.

2. Description of the Related Art

LIGA is a German acronym that stands for Lithographie, Galvanofomung, and Abformung referring to lithography, electroplating and molding, respectively. A LIGA process refers to a microstructure processing technique including an X-ray lithography process, an electroforming process, and a plastic molding process.

Meanwhile, a micromachine, which is also referred to as a micro electromechanical system (MEMS), is manufactured by applying semiconductor fabrication techniques, such as an etching process, a photolithography process, and a plating process. In recent years, laborious research for the fabrication of micromachines using a LIGA process has progressed. A simple microstructure may be easily fabricated using a LIGA process including a one-time X-ray lithography process and a one-time plating process. The fabrication of a complicated microstructure may involve, however, a multi-step LIGA process including performing an X-ray lithography process twice or more and performing a plating process twice or more.

In the multi-step LIGA process, a plurality of photoresist layers should be precisely aligned in order to fabricate a complicated microstructure without failures. Contemporarily, the photoresist layers have been aligned using an optical method. The alignment of the photoresist layers using the optical method requires, however, not only a lot of tools, such as a jig for fixing a substrate to which the photoresist layers are adhered, a Charge-Coupled Device (CCD) camera for photographing an image, and a microscope for closely comparing and observing photoresist patterns, but also a highly skillful aligning technique. Therefore, the alignment of the photoresist layers would be costly and take much time, thus lowering the productivity of the microstructure.

SUMMARY OF THE INVENTION

It is therefore an object of the present invention to provide an improved method for manufacturing a microstructure using a LIGA process.

It is another object to provide a process of easily aligning a plurality of photoresist layers using a mechanical method instead of an optical method, a mask used for the LIGA process, and a method for manufacturing the mask.

According to an aspect of the present invention, a mask used for a LIGA may be constructed with a substrate for allowing X-rays to pass through, and an X-ray absorbing layer stacked on the substrate. The X-ray absorbing layer may be constructed with a plating pattern for forming a plating hole in a photosensitive layer, an aligning pin pattern for forming an aligning pin used for stacking and aligning a plurality of photosensitive layers in the photosensitive layer, and an aligning pinhole pattern for forming an aligning pinhole in which the aligning pin is inserted in the photosensitive layer.

The substrate for the mask may be made from silicon (Si).

The X-ray absorbing layer may be made from gold (Au).

According to another aspect of the present invention, a method for manufacturing a mask used for a LIGA process contemplates stacking an X-ray absorbing layer on a substrate for the mask for allowing X-rays to pass through, and etching the X-ray absorbing layer to form a plating pattern for forming a plating hole, an aligning pin pattern for forming an aligning pin used for aligning a plurality of stacked photosensitive layers, and an aligning pinhole pattern for forming an aligning pinhole in which the aligning pin is inserted.

The substrate for the mask maybe made from silicon (Si).

The X-ray absorbing layer may be made from gold (Au).

The stacking of the X-ray absorbing layer on the substrate for the mask may include forming a seed layer by deposition a metal on the substrate for the mask, and forming a plating layer by plating the seed layer with the metal.

According to yet another aspect of the present invention, a method for manufacturing a microstructure using a LIGA process contemplates forming a substrate for the microstructure, forming a plurality of photosensitive layers, each photosensitive layer having a plating hole and an aligning pinhole, and forming an aligning pin capable of being inserted into the aligning pinhole, with the aligning pinholes of the photosensitive layers being formed in corresponding positions, and repeating a process of stacking the photosensitive layer on the substrate for the microstructure and a process of forming a plating layer by plating the plating hole of the stacked photosensitive layer with a metal for a number of times corresponding to the number of the photosensitive layers, and when the photosensitive layers are stacked on the substrate for the structure, the photosensitive layers being aligned with one another by inserting the aligning pin into the aligning pinholes of all the photosensitive layers stacked on the substrate for the microstructure to penetrate all the photosensitive layers.

The forming of the photosensitive layer having the plating hole and the aligning pinhole may include preparing a mask including a substrate for the mask for allowing X-rays to pass through and an X-ray absorbing layer stacked on the substrate for the mask, with the X-ray absorbing layer including a plating pattern for forming the plating hole and an aligning pinhole pattern for forming the aligning pinhole, applying the mask to the photosensitive layer in which the plating hole and the aligning pinhole are not formed, irradiating the photosensitive layer with X-rays, and forming the plating hole and the aligning pinhole in the photosensitive layer by developing the photosensitive layer.

The forming of the aligning pin may include preparing a mask including a substrate for the mask for allowing X-rays to pass through and an X-ray absorbing layer stacked on the substrate for the mask, with the X-ray absorbing layer including an aligning pin pattern for forming the aligning pin, applying the mask to the photosensitive layer in which the aligning pin is not formed, irradiating the photosensitive layer with X-rays, forming the aligning pin in the photosensitive layer by developing the photosensitive layer, and separating the aligning pin from the photosensitive layer.

The forming of the photosensitive layer having the plating hole and the aligning pinhole and the aligning pin may include preparing a mask comprising a substrate for the mask for allowing X-rays to pass through and an X-ray absorbing layer stacked on the substrate for the mask, with the X-ray absorbing layer including a plating pattern for forming the plating hole, an aligning pinhole pattern for forming the aligning pinhole, and an aligning pin pattern for forming the aligning pin, applying the mask to the photosensitive layer in which the plating hole, the aligning pinhole, and the aligning pin are not formed, irradiating the photosensitive layer with X-rays, forming the plating hole, the aligning pinhole, and the aligning pin in the photosensitive layer by developing the photosensitive layer; and separating the aligning pin from the photosensitive layer.

The substrate for the mask may be made from silicon (Si).

The X-ray absorbing layer may be made from gold (Au).

After forming the last plating layer, all the photosensitive layers may be removed from the substrate for the microstructure.

After removing all the photosensitive layers, the substrate for the microstructure may be processed such that at least a portion of the substrate for the microstructure is included in the microstructure, after removing all the photosensitive layers.

Each of the photosensitive layers may be made from polymethyl methacrylate (PMMA).

The substrate for the microstructure may be made from a metal.

The substrate for the microstructure and the plating layer may be made from the same metal.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

A mask used for a LIGA (i.e., Lithographie, Galvanoformung, and Abformung) process, a method for manufacturing the mask, and a method for manufacturing a microstructure using a LIGA process according to the principles of the present invention will now be described more fully hereinafter with reference to the accompanying drawings, in which exemplary embodiments of the invention are shown.

Figure 1A:
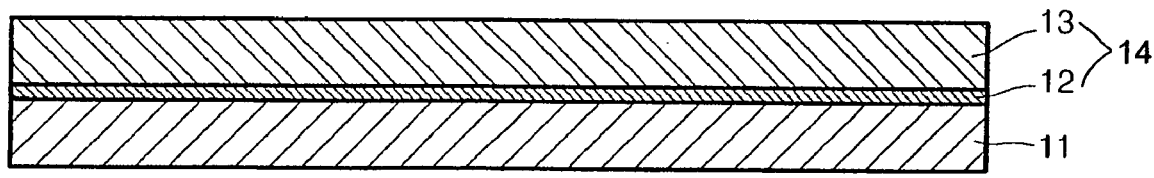
FIGS. 1A through 1C are a sequence of cross sectional views of a mask used for a LIGA process during a series of steps performed during a manufacturing process according to an embodiment of the principles of the present invention.
Figure 1B:
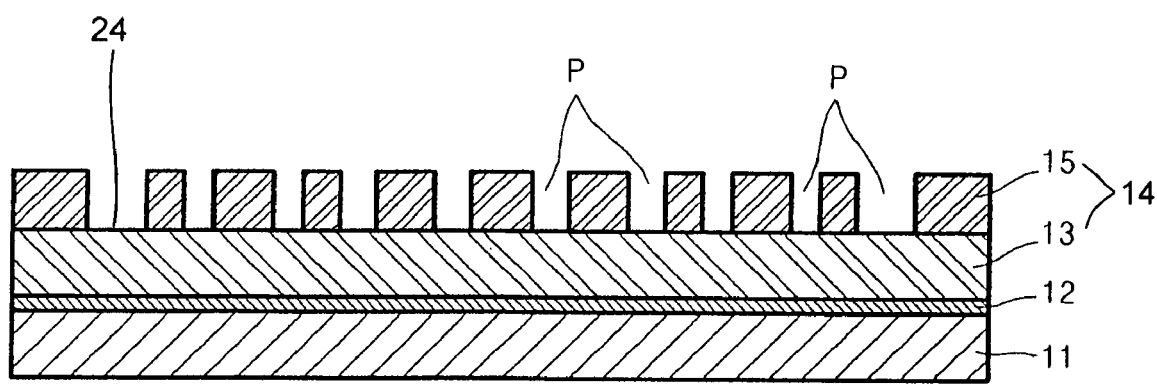
Figure 1C:
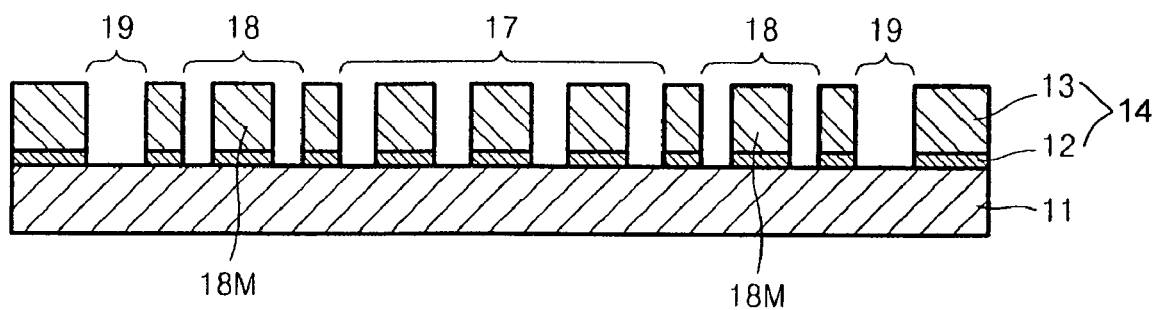

FIGS. 1A through 1C are a sequence of cross sectional views of a mask used for a LIGA process during a series of steps performed during a manufacturing process according to an embodiment of the principles of the present invention.

Referring to FIG. 1A, a mask used for the LIGA process according to the embodiment of the present invention is constructed with a substrate 11 and a X-ray absorbing layers 14 which is stacked on substrate 11. Substrate 11 may be made from a material that transmits X-rays, for example, silicon (Si), silicon nitride, boron nitride, and polyimide. For example, substrate 11 may be made from Si, which has good flatness and hardness.

X-ray absorbing layer 14 maybe made from a metal that absorbs X-rays, for example, gold (Au). The formation of X-ray absorbing layer 14 contemplates depositing an Au layer on substrate 11 to form a seed layer 12 and plating seed layer 12 with Au to form a plating layer 13.

Referring to FIG. 1B, photoresist 15 is coated on plating layer 13 and patterned using a photolithography process to form a certain photoresist pattern P. Area 24 of X-ray absorbing layer 14 which is exposed by photoresist 15 with pattern P, may be etched using photoresist 15 with pattern P as an etch mask, thereby forming a plating pattern 17, an aligning pin pattern 18, and an aligning pinhole pattern 19.

Figure 3A:
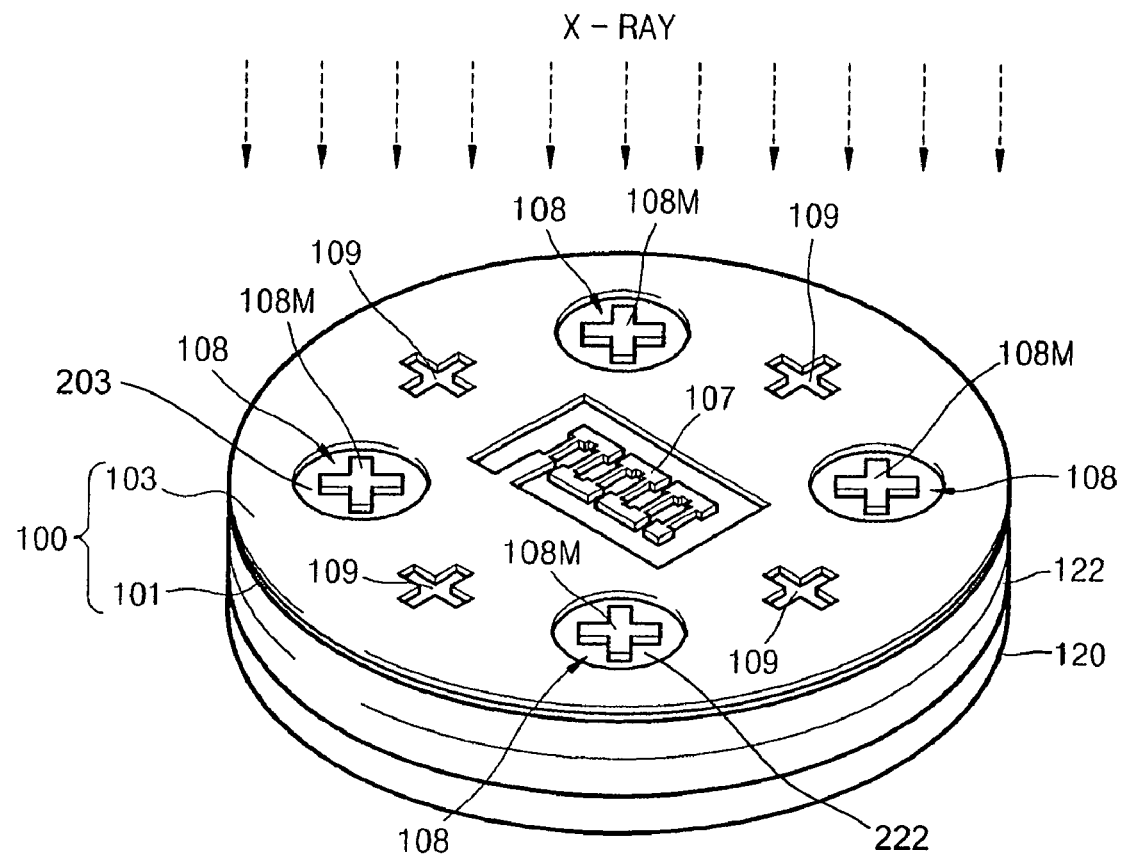
FIGS. 3A through 3J are a sequence of oblique views of a microstructure during a series of steps performed during a manufacturing process using a LIGA process according to an embodiment of the principles of the present invention.
Figure 3B:
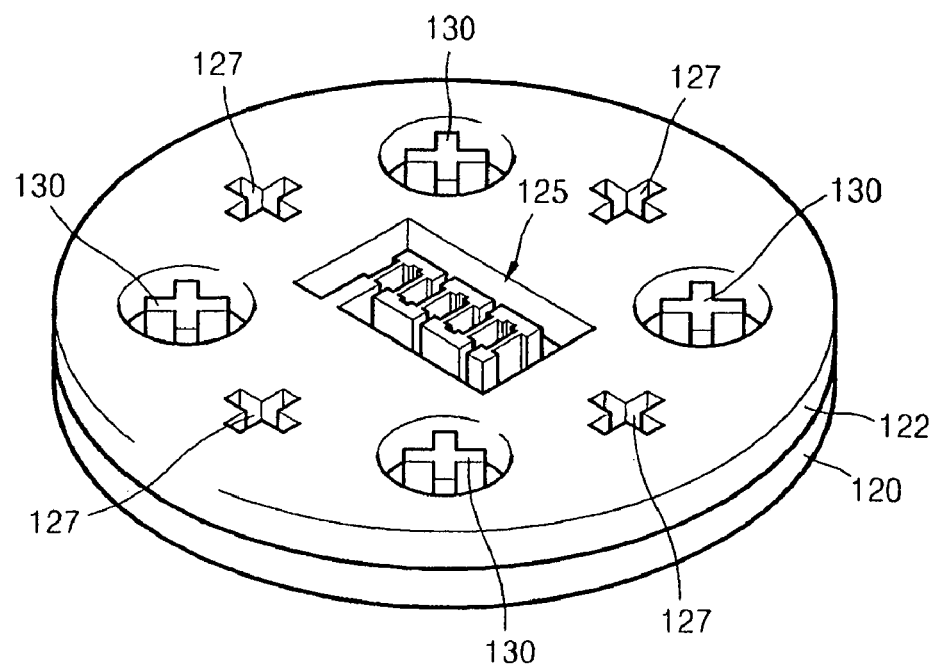

Plating pattern 17 serves to form a first plating hole 125 (refer to FIG. 3B) in a first photosensitive layer 122 (refer to FIG. 3B). Aligning pin pattern 18 serves to form an aligning pin 130 (refer to FIG. 3B) that is used to align a plurality of stacked photosensitive layers with first photosensitive layer 122. Aligning pinhole pattern 19 serves to form an aligning pinhole 127 (refer to FIG. 3B) in which aligning pin 130 is inserted. Thus, plating pattern 17 corresponds to the shape of a portion of a microstructure to be manufactured, and an unetched portion 18M of aligning pin pattern 18 has the same shape and size as aligning pinhole pattern 19.

Figure 2:
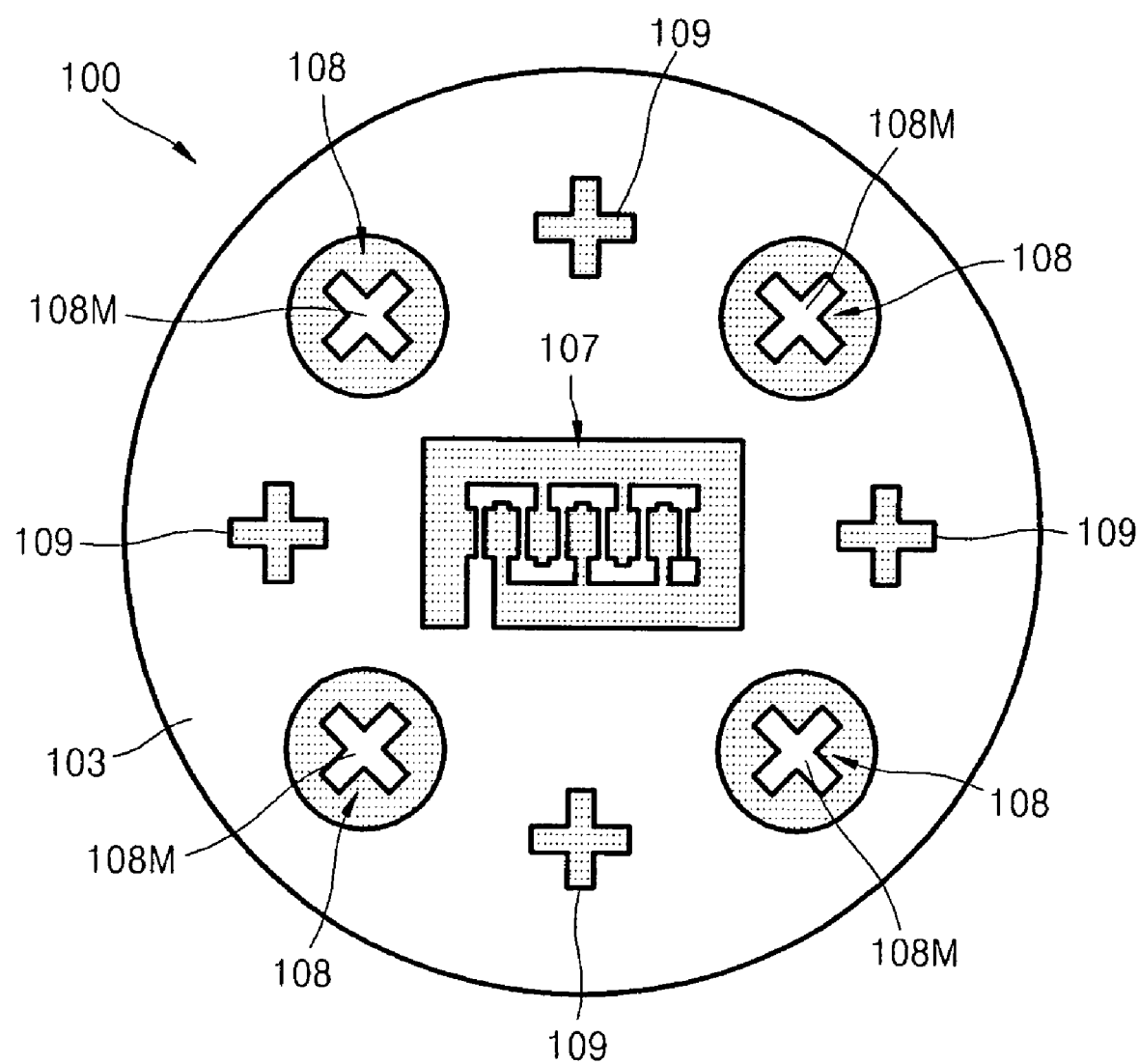
FIG. 2 is a plan view of a mask used for a LIGA process constructed as an embodiment according to the principles of the present invention.

Hereinafter, a method for manufacturing a microstructure using a LIGA process will be described with reference to FIGS. 2 and 3A through 3J. FIG. 2 is a plan view of a mask used for a LIGA process constructed as an embodiment of the principles of the present invention, and FIGS. 3A through 3J are a sequence of oblique views of a microstructure during a series of steps performed during a manufacturing process using a LIGA process according to an embodiment of the principles of the present invention.

Referring to FIG. 2, a first mask 100 used for the manufacture of a microstructure 170 (refer to FIG. 3J) is an example of the mask that is manufactured using the method described with reference to FIGS. 1A through 1C. Thus, first mask 100 is constructed with a substrate 101 (refer to FIG. 3A) and an X-ray absorbing layer 103. Substrate 101 is made from Si, which transmits X-rays. X-ray absorbing layer 103 which is made from Au, is stacked on substrate 101. A first plating pattern 107, a first aligning pinhole pattern 109, and an aligning pin pattern 108 are formed in X-ray absorbing layer 103. First plating pattern 107, first aligning pinhole pattern 109, and aligning pin pattern 108 are used to form first plating hole 125, first aligning pinhole 127, and aligning pin 130, respectively, in first photosensitive layer 122 (refer to FIG. 3B). An unetched portion 108M of aligning pin pattern 108 and aligning pinhole pattern 109 are both cross-shaped and have the same size within a permitted error limit.

Referring to FIG. 3A, first photosensitive layer 122 is adhered to a substrate 120 for forming the microstructure, with substrate 120 being made from copper (Cu). First photosensitive layer 122 is made from polymethyl methacrylate (PMMA), which may be changed into a soluble state, i.e., become soluble in a developing solution after irradiated by X-rays. In stead of PMMA, acryl and polycarbonate may be used to form first photosensitive layer 122. Next, first photosensitive layer 122 is masked using first mask 100 and irradiated by X-rays. Thus, X-rays are transmitted through portion 203 of X-ray absorbing layer 103 from which Au is removed and substrate 101, onto first photosensitive layer 122 so that exposed portions 222 of first photosensitive layer 122 which are irradiated by X-rays are changed into a soluble state. The X-rays maybe formed by synchrotron radiation (SR) generated by a synchrotron radiator in order to increase the reactivity of the X-rays with first photosensitive layer 122.

Figure 3C:
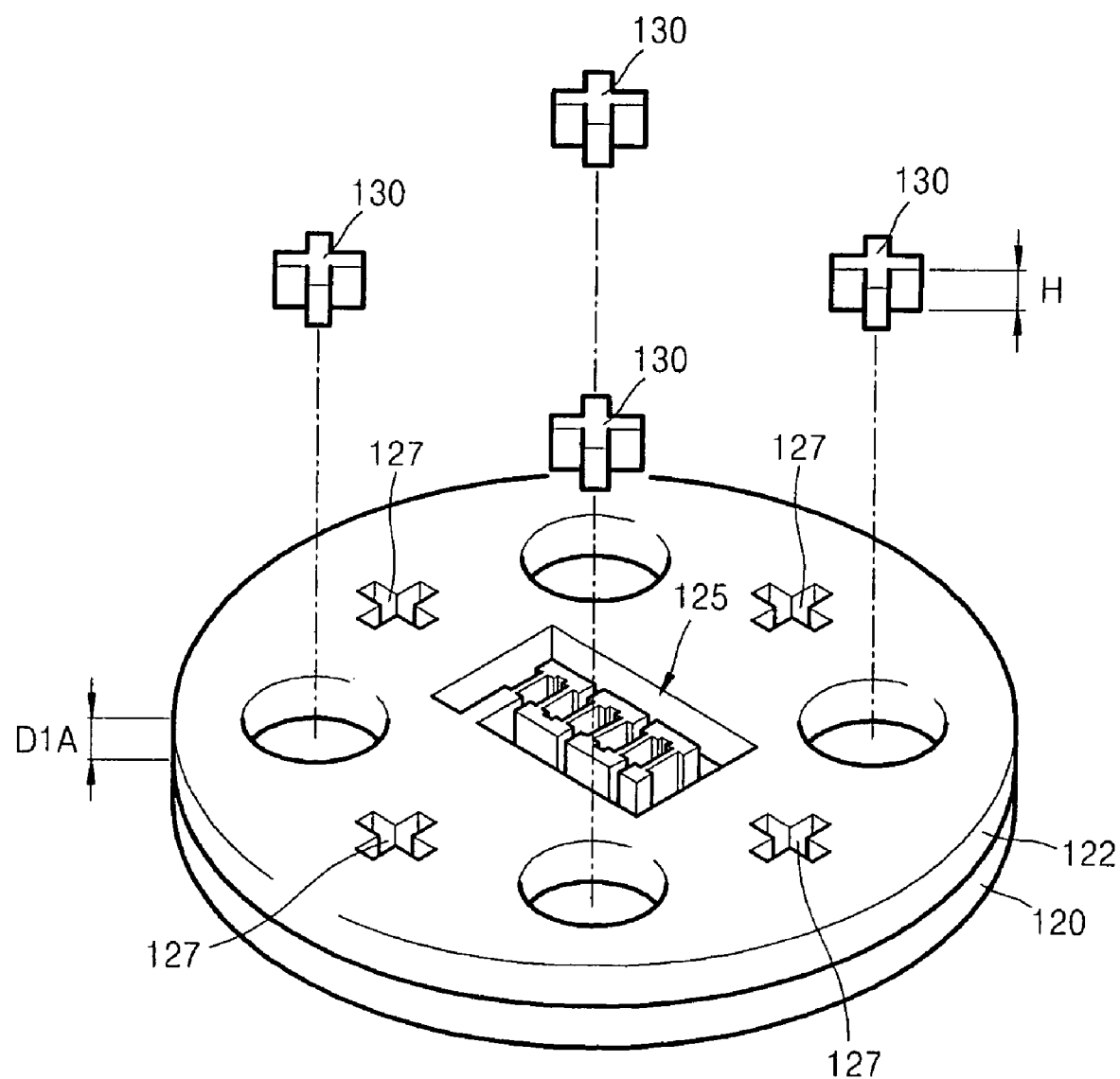

By developing first photosensitive layer 122 using the developing solution, portions 222 exposed to the X-rays are removed so that first plating hole 125, first aligning pinhole 127, and aligning pin 130 are formed in first photosensitive layer 122 as illustrated in FIG. 3B. First plating hole 125, first aligning pinhole 127, and aligning pin 130 correspond to first plating pattern 107, first aligning pinhole pattern 109, and unetched portion 108M of aligning pin pattern 108, respectively, of first mask 100. As illustrated in FIG. 3C, aligning pin 130 is separated from first photosensitive layer 122.

Figure 3D:
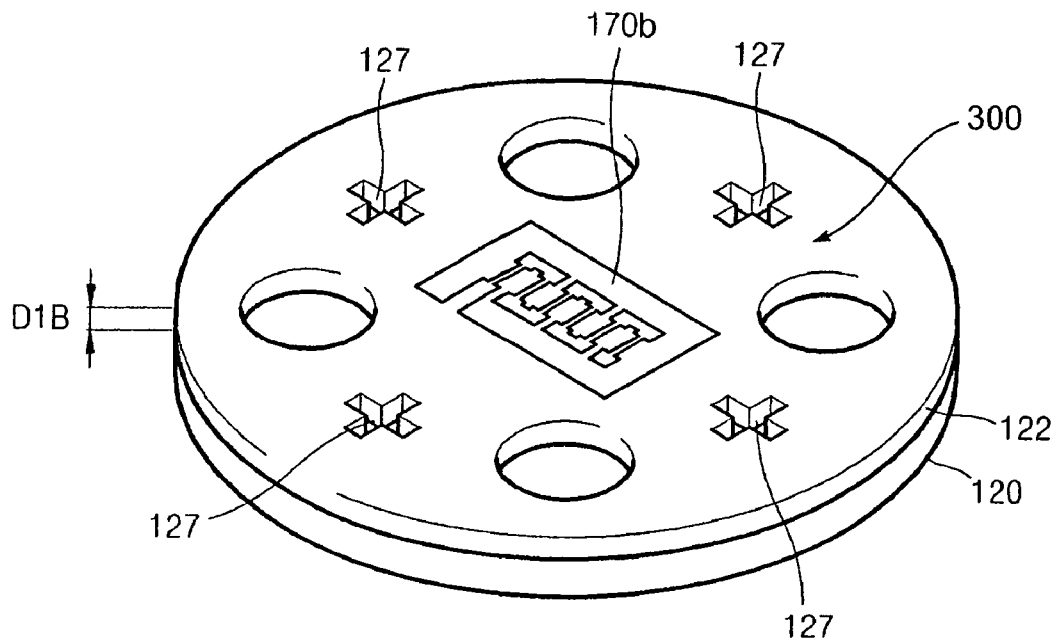

Referring to FIG. 3D, first plating hole 125 is plated with copper (Cu) to form a first plating layer 170b. In this case, a taping process may be used so that first aligning pinhole 127 is not plated with copper. In the current embodiment as illustrated in FIG. 3D, both substrate 120 for the microstructure and first plating layer 170b are made from copper. The present invention is, however, not limited to this exemplary embodiment and substrate 120 for the microstructure and first plating layer 170b may be made from other material than copper. In addition, the material for forming substrate 120 and the material for forming first plating layer 170b may be different from each other.

After forming first plating layer 170b, top surfaces 300 of first photosensitive layer 122 and first plating layer 170b may be lapped so that top surfaces 300 are made smooth. Also, because thickness D1B of first photosensitive layer 122 measured after the lapping process is smaller than thickness D1A (refer to FIG. 3C) first photosensitive layer 122 measured before the lapping process, a height H (refer to FIG. 3C) of aligning pin 130 becomes greater than thickness D1B of first photosensitive layer 122. In the current embodiment of the principles of the present invention, height H of aligning pin 130 is almost equal to the sum of thickness D1B of first photosensitive layer 122 measured after the lapping process and thickness D2 (refer to FIG. 3F) of a second photosensitive layer 152 (refer to FIG. 3F) that will be described later. Therefore, thickness D1A of first photosensitive layer 122 measured before the lapping process, which corresponds to height H of aligning pin 130, is pre-selected to be about the same as the sum of thickness D1B of first photosensitive layer 122 measured after the lapping process and thickness D2 of second photosensitive layer 152.

Figure 3E:
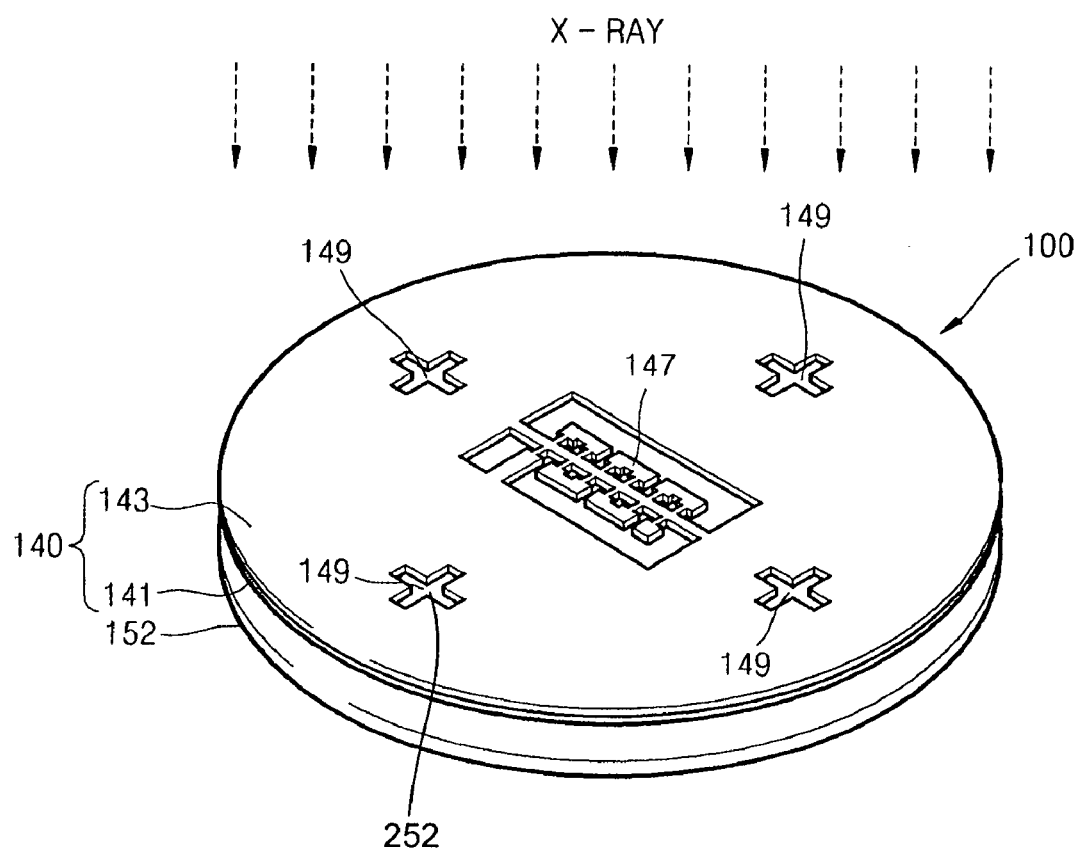

Referring to FIG. 3E, second photosensitive layer 152 and second mask 140 are prepared. Second photosensitive layer 152 may be made from PMMA like first photosensitive layer 122. Second mask 140 is constructed with substrate 141 and X-ray absorbing layer 143. Substrate 141 of second mask 140 is made from silicon (Si) having an X-ray transmission characteristic. X-ray absorbing layer 143, which is made from gold (Au), is stacked on substrate 141 of second mask 140.

A second plating pattern 147 and a second aligning pinhole pattern 149 are formed in X-ray absorbing layer 143 of second mask 140. Second plating pattern 147 and second aligning pinhole pattern 149 are respectively used to form a second plating hole 155 (refer to FIG. 3F) and a second aligning pinhole 157 (refer to FIG. 3F) in second photosensitive layer 152. Aligning pin pattern 108 as formed in first mask 100 (refer to FIG. 3A) is, however, not formed in X-ray absorbing layer 143 of second mask 140. Second plating pattern 147 may be either different from or the same as first plating pattern 107 (refer to FIG. 3A) of first mask 100 according to the type of the microstructure to be manufactured. Second aligning pinhole pattern 157 is formed in the same shape as first aligning pinhole pattern 109 (refer to FIG. 3A) of first mask 100 and is located in a position corresponding to first aligning pinhole pattern 109. Second plating pattern 147 and second aligning pinhole pattern 149 may be formed by performing photolithography and etching processes on X-ray absorbing layer 143.

Figure 3F:
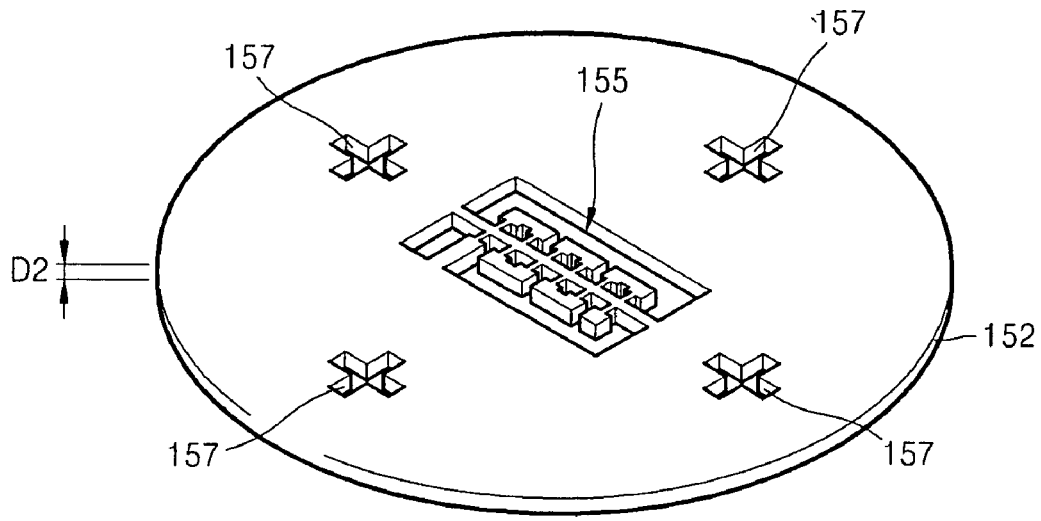

Second photosensitive layer 152 is masked using second mask 140 and irradiated by X-rays. The X-rays may be formed by SR generated by a synchrotron radiator. By developing second photosensitive layer 152 using a developing solution, portions 252 exposed to the X-rays are removed so that second plating hole 155 and second aligning pinhole 157 are formed in second photosensitive layer 152 as illustrated in FIG. 3F.

Figure 3G:
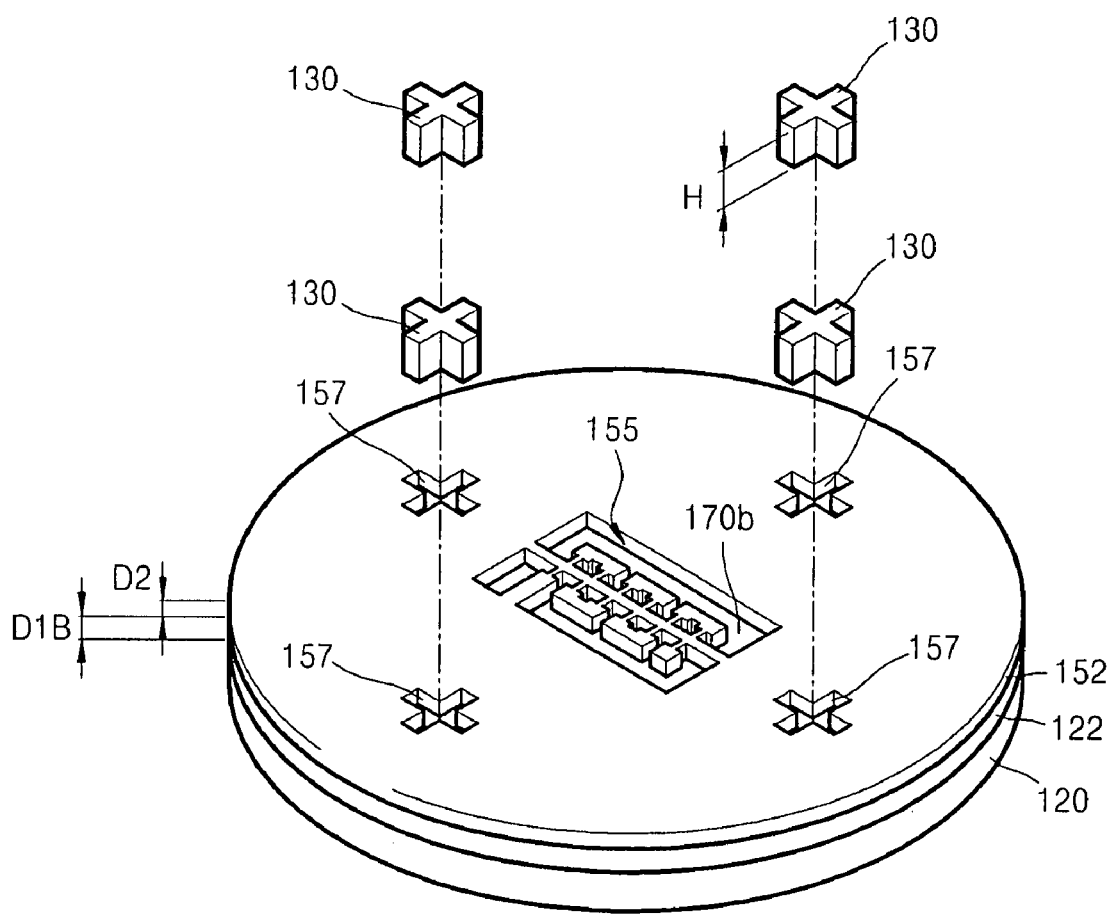

Referring to FIG. 3G, second photosensitive layer 152 is placed on first photosensitive layer 122 including first plating layer 170b (refer to FIG. 3B), and aligning pin 130 is inserted into first aligning pinhole 127 (refer to FIG. 3D) and second aligning pinhole 157 so that aligning pin 130 penetrates both first and second aligning pinholes 127 and 157. By inserting aligning pin 130 into first and second aligning pinholes 127 and 157, second photosensitive layer 152 is aligned with first photosensitive layer 122. Thereafter, second photosensitive layer 152 is closely adhered to first photosensitive layer 122 to maintain the aligned state of first and second photosensitive layer 122 and 152.

Figure 3H:
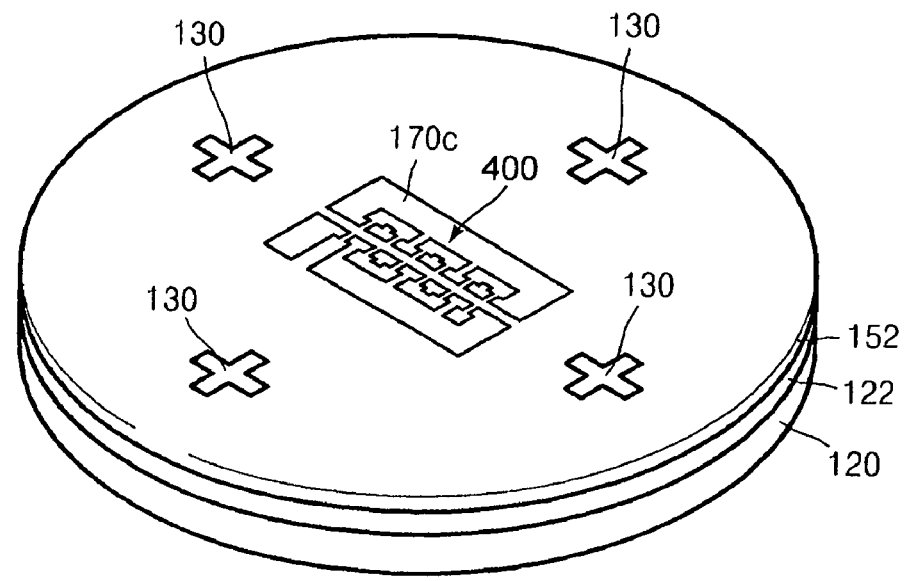
Figure 3I:
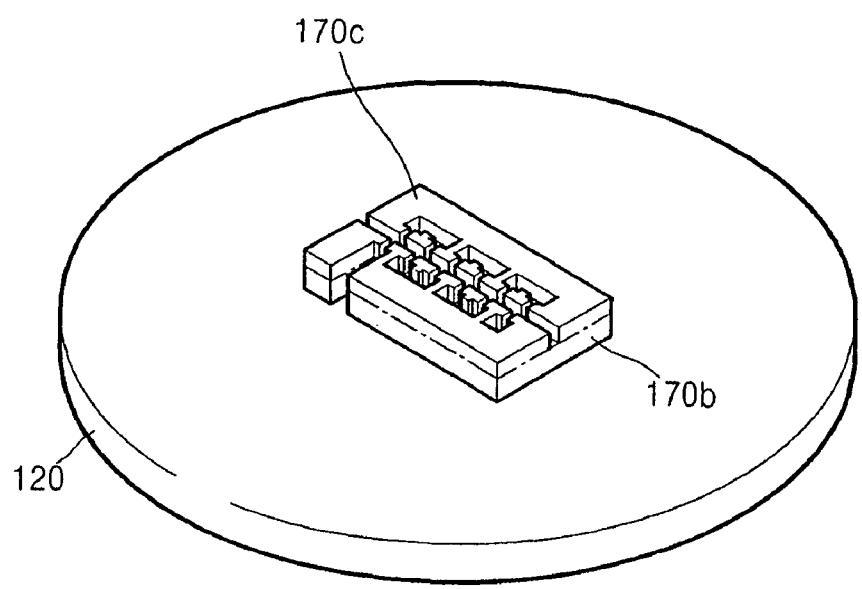

Referring to FIG. 3H, second plating hole 155 is plated with copper to form a second plating layer 170c. A metal used for forming second plating layer 170c is not limited to copper and depends on the type of a microstructure to be manufactured. After forming second plating layer 170c, top surface 400 of second plating layer 170c may be lapped. After the plating process, first and second photosensitive layers 122 and 152 are removed from substrate 120 for the microstructure using a remover, so that first and second plating layers 170b and 170c are sequentially formed on substrate 120 for the microstructure as illustrated in FIG. 3I.

Figure 3J:
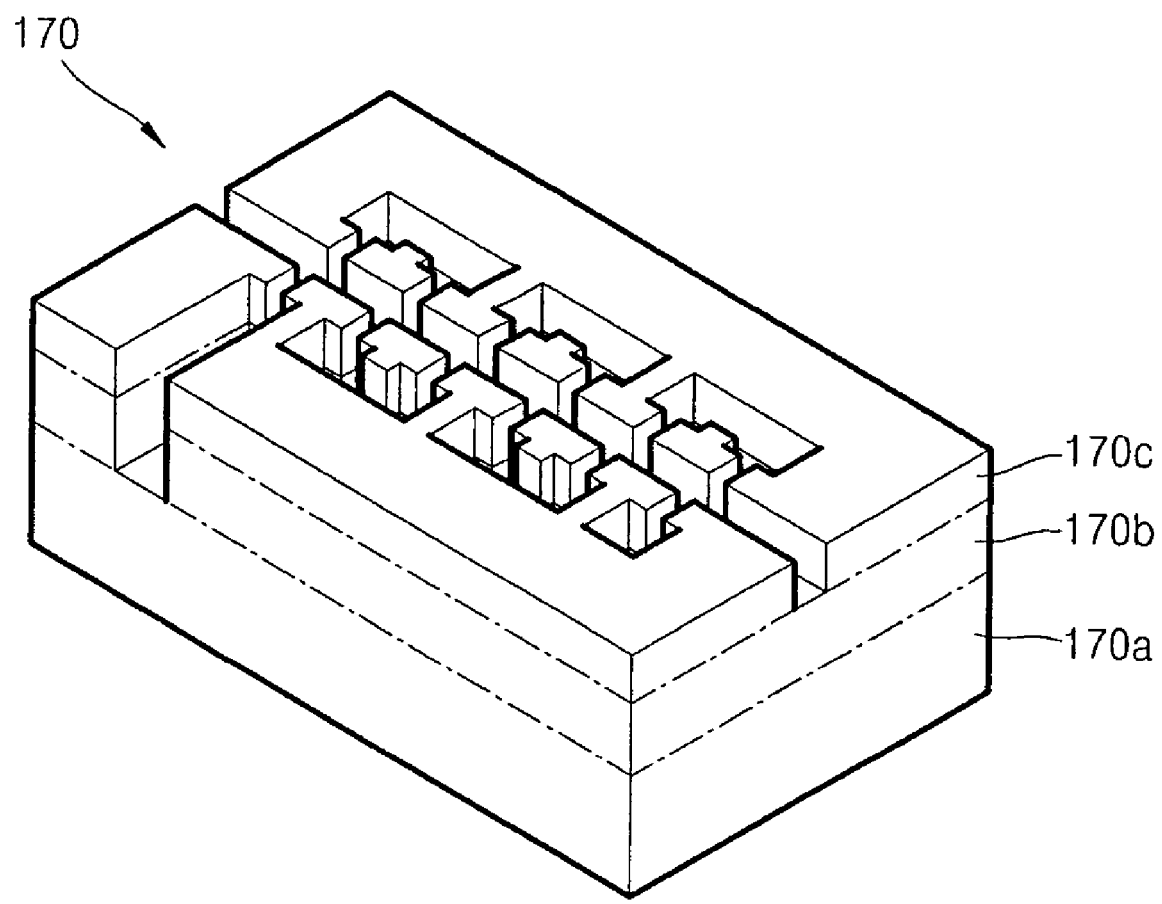

Referring to FIG. 3J, a portion 170a of substrate 120 (refer to FIG. 3I) for the microstructure, which supports first plating layer 170b, is cut to complete microstructure 170.

When conducting an experiment for forming a microstructure using the above-described method, a feature tolerance ranging from 2 to 3 micrometer (μm), which is smaller than a feature tolerance ranging from several tens to several hundreds of micrometers obtained using a contemporary micromachining process, was obtained. Also, an alignment tolerance between first and second plating layers 170b and 170c ranged from only 2 μm to 3 μm, and a surface roughness ranged from only 50 nm to 100 nm.

According to the present invention as described above, when a microstructure is manufactured using a LIGA process, a plurality of photosensitive layers may be easily aligned with one another using a simple mechanical method. As a consequence, an alignment tolerance can be lessened, a time and cost taken to align the photosensitive layers can be reduced, and productivity can be improved.

In the current embodiment of the present invention, a microstructure is fabricated by using two photosensitive layers. A microstructure, however, maybe fabricated by using more than three photosensitive layers. Further, the aligning pin may not be formed in the photosensitive layer but separately prepared.

While the present invention has been particularly shown and described with reference to exemplary embodiments thereof, it will be understood by those of ordinary skill in the art that various changes in form and details maybe made therein without departing from the spirit and scope of the present invention as defined by the following claims.

What is claimed is:

1. A mask used for a Lithographie, Galvanofomung, and Abformung process, the mask comprising:
   a substrate allowing X-rays to pass through the substrate; and
   an X-ray absorbing layer stacked on the substrate, with the X-ray absorbing layer comprising:
   a plating pattern forming a plating hole in a photosensitive layer;
   an aligning pin pattern forming an aligning pin in the same photosensitive layer, with said aligning pin disposable to assure alignment of a stack of a plurality of photosensitive layers; and
   an aligning pinhole pattern forming, in the same photosensitive layer, an aligning pinhole in which the aligning pin is inserted while assuring said alignment of the stack of the plurality of photosensitive layers.

2. The mask of claim 1, comprised of the substrate being made from silicon (Si).

3. The mask of claim 1, comprised of the X-ray absorbing layer being made from gold (Au).

4. A method for manufacturing a mask used for a Lithographie, Galvanofomung, and Abformung process, the method comprising:
   stacking an X-ray absorbing layer on a substrate for allowing X-rays to pass through the substrate; and
   etching the X-ray absorbing layer to form a plating pattern forming a plating hole in a photosensitive layer, an aligning pin pattern forming an aligning pin in the same photosensitive layer and disposable to assure alignment of a plurality of stacked photosensitive layers, and an aligning pinhole pattern forming an aligning pinhole in which the aligning pin is inserted in the same photosensitive layer while assuring said alignment of the stack of the plurality of photosensitive layers.

5. The method of claim 4, comprised of the substrate being made from silicon (Si).

6. The method of claim 4, comprised of the X-ray absorbing layer being made from gold (Au).

7. The method of claim 4, with the stacking of the X-ray absorbing layer on the substrate comprising:
   forming a seed layer by depositing metal on the substrate for the mask; and
   forming a plating layer by plating the seed layer with the metal.

8. A method for manufacturing a microstructure using a Lithographie, Galvanofomung, and Abformung process, the method comprising:
   forming a substrate for the microstructure, a plurality of photosensitive layers, each photosensitive layer having a plating hole and an aligning pinhole, and an aligning pin insertable into the aligning pinhole, with the aligning pinholes of the plurality of photosensitive layers being formed in positions corresponding to each other; and
   repeating a process of stacking one of the photosensitive layers on the substrate for the microstructure and plating the plating hole of the stacked photosensitive layer with metal for forming a plating layer for a number of times corresponding to the number of the photosensitive layers, and when the photosensitive layers are stacked on the substrate for the microstructure, the photosensitive layers become aligned with one another by inserting the aligning pin into the aligning pinholes of all of the photosensitive layers stacked on the substrate for the microstructure to penetrate all the photosensitive layers.

9. The method of claim 8, comprised of forming the photosensitive layer having the plating hole and the aligning pinhole by:
   preparing a mask comprising a substrate for the mask for allowing X-rays to pass through the substrate from the mask and an X-ray absorbing layer stacked on the substrate for the mask, with the X-ray absorbing layer comprising a plating pattern forming the plating hole and an aligning pinhole pattern defining the aligning pinhole;
   applying the mask to the photosensitive layer;
   irradiating the photosensitive layer with X-rays; and
   forming the plating hole and the aligning pinhole in the photosensitive layer by developing the photosensitive layer.

10. The method of claim 8, comprised of forming the aligning pin by:
    preparing a mask comprising a substrate for the mask for allowing X-rays to pass through the substrate for the mask and an X-ray absorbing layer stacked on the substrate for the mask, with the X-ray absorbing layer comprising an aligning pin pattern defining the aligning pin;
    applying the mask to the photosensitive layer;
    irradiating the photosensitive layer with X-rays;
    forming the aligning pin in the photosensitive layer by developing the photosensitive layer; and
    separating the aligning pin from the photosensitive layer.

11. The method of claim 8, comprised of forming the photosensitive layer having the plating hole and the aligning pinhole and the aligning pin by:
    preparing a mask comprising a substrate for the mask for allowing X-rays to pass through the substrate for the mask and an X-ray absorbing layer stacked on the substrate for the mask, with the X-ray absorbing layer comprising a plating pattern forming the plating hole, an aligning pinhole pattern forming the aligning pinhole, and an aligning pin pattern defining the aligning pin;
    applying the mask to the photosensitive layer;
    irradiating the photosensitive layer with X-rays;
    forming the plating hole, the aligning pinhole, and the aligning pin in the photosensitive layer by developing the photosensitive layer; and
    separating the aligning pin from the photosensitive layer.

12. The method of any one of claims 9 through 11, comprised of the substrate for the mask being made from silicon (Si).

13. The method of any one of claims 9 through 11, comprised of the X-ray absorbing layer being made from gold (Au).

14. The method of claim 8, comprised of removing all the photosensitive layers from the substrate for the microstructure after forming the last plating layer.

15. The method of claim 14, comprised of processing the substrate for the microstructure by including in the microstructure at least a portion of the substrate for the microstructure after removing all the photosensitive layers.

16. The method of claim 8, comprised of each of the photosensitive layers being made from PMMA (polymethyl methacrylate).

17. The method of claim 8, comprised of the substrate for the microstructure being made from a metal.

18. The method of claim 8, comprised of the substrate for the microstructure and the plating layer being made from the same metal.

19. A mask used for a Lithographie, Galvanofomung, and Abformung process, the mask comprising:
    a substrate allowing X-rays to pass through the substrate; and an X-ray absorbing layer stacked on the substrate, with the X-ray absorbing layer positioned upon the substrate and simultaneously creating:
a plating pattern forming a plating hole in a photosensitive layer;
an aligning pin pattern forming an aligning pin in the same photosensitive layer, with the aligning pin disposable to assure alignment of a stack of a plurality of photosensitive layers; and
an aligning pinhole pattern forming an aligning pinhole in which the aligning pin is inserted in the same photosensitive layer to assure said alignment of the stack of the plurality of photosensitive layers.

* * * * *